United States Patent
Faber et al.

(10) Patent No.: US 12,269,404 B2
(45) Date of Patent: Apr. 8, 2025

(54) CAPACITIVE SENSOR DEVICE WITH SELECTIVE LOADING AND COUPLING MEASUREMENT MODE

(71) Applicant: IEE INTERNATIONAL ELECTRONICS & ENGINEERING S.A., Echternach (LU)

(72) Inventors: Thomas Faber, Schweich (DE); Michael Puetz, Trier (DE); Gianluca Favalli, Aubange (BE); Baptiste Anti, Hettange-Grande (FR)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 225 days.

(21) Appl. No.: 17/603,110

(22) PCT Filed: Apr. 7, 2020

(86) PCT No.: PCT/EP2020/059938
§ 371 (c)(1),
(2) Date: Oct. 12, 2021

(87) PCT Pub. No.: WO2020/208043
PCT Pub. Date: Oct. 15, 2020

(65) Prior Publication Data
US 2022/0200594 A1  Jun. 23, 2022

(30) Foreign Application Priority Data

Apr. 12, 2019 (LU) ........................................ 101180
Jul. 22, 2019 (LU) ........................................ 101321

(51) Int. Cl.
*B60R 21/015* (2006.01)
*B62D 1/04* (2006.01)
(Continued)

(52) U.S. Cl.
CPC ............ *B60R 21/015* (2013.01); *B62D 1/046* (2013.01); *B62D 1/06* (2013.01); *H03K 17/955* (2013.01);
(Continued)

(58) Field of Classification Search
CPC ........... H03K 17/955; H03K 2217/945; B62D 1/046; B62D 1/06
(Continued)

(56) References Cited

U.S. PATENT DOCUMENTS 5,914,610 A * 6/1999 Gershenfeld .......... G01B 7/003
340/870.37
5,936,412 A * 8/1999 Gershenfeld ..... B60R 21/01532
340/870.37
(Continued)

FOREIGN PATENT DOCUMENTS

CA  2296549 C * 6/2010 ......... A61K 39/0008
CN  206528519 U * 9/2017
(Continued)

OTHER PUBLICATIONS

International Search Report corresponding to International Application No. PCT/EP2020/059938, dated Jul. 2, 2020, 4 pages.
(Continued)

*Primary Examiner* — Judy Nguyen
*Assistant Examiner* — James Split
(74) *Attorney, Agent, or Firm* — Reising Ethington P.C.

(57) ABSTRACT

A capacitive measurement circuit for a capacitive sensing device having a plurality of antenna electrodes includes: a measurement signal voltage source, a remotely controllable switching unit, and a current measurement circuit. The switching unit includes a plurality of ports and switching members that are configured to provide connections between selected ports. The measurement signal voltage source and
(Continued)

the current measurement circuit are operatively connected to a distinct port. Each antenna electrode is individually connectable to a distinct port. The switching unit is configured to connect, within a same measurement cycle, each of the antenna electrodes to the voltage output port and the current measurement circuit for loading mode operation. The switching unit is further configured to connect at least one of the antenna electrodes to the voltage output port and at least one other antenna electrode of the antenna electrodes to the current measurement circuit for coupling mode operation.

9 Claims, 5 Drawing Sheets

(51) Int. Cl.
  *B62D 1/06* (2006.01)
  *H03K 17/955* (2006.01)
  *H03K 17/96* (2006.01)
(52) U.S. Cl.
  CPC ............ *H03K 2017/9602* (2013.01); *H03K 2017/9615* (2013.01); *H03K 2217/945* (2013.01); *H03K 2217/96078* (2013.01)
(58) Field of Classification Search
  USPC ........................................ 324/519
  See application file for complete search history.

(56) References Cited

U.S. PATENT DOCUMENTS

| | | | | |
|---|---|---|---|---|
| 6,051,981 | A * | 4/2000 | Gershenfeld | H03K 17/955 324/687 |
| 6,066,954 | A * | 5/2000 | Gershenfeld | G01V 3/088 324/687 |
| 6,161,070 | A * | 12/2000 | Jinno | B60R 21/01532 701/45 |
| 8,354,936 | B2 * | 1/2013 | Ootaka | B60N 2/002 340/552 |
| 9,000,331 | B2 * | 4/2015 | Virnich | B60N 2/5685 324/686 |
| 9,132,850 | B2 * | 9/2015 | Virnich | B60R 21/01532 |
| 9,248,851 | B2 * | 2/2016 | Van'tZelfde | B62D 1/046 |
| 9,658,266 | B2 * | 5/2017 | Petereit | G01R 1/18 |
| 10,457,236 | B2 * | 10/2019 | Lamesch | B60R 21/01532 |
| 10,790,822 | B2 * | 9/2020 | Wendt | H01H 13/70 |
| 10,797,663 | B2 * | 10/2020 | Lamesch | H03F 3/387 |
| 10,822,014 | B2 * | 11/2020 | Boittiaux | B62D 1/06 |
| 10,946,769 | B2 * | 3/2021 | Althaus | B60R 21/01532 |
| 11,050,422 | B2 * | 6/2021 | Lamesch | H03K 17/955 |
| 11,193,797 | B2 * | 12/2021 | Lamesch | G01D 5/24 |
| 11,214,172 | B2 * | 1/2022 | Althaus | G01N 27/223 |
| 11,378,420 | B2 * | 7/2022 | Althaus | B62D 1/046 |
| 11,613,293 | B2 * | 3/2023 | Sabourin | G01D 18/00 324/601 |
| 2004/0196150 | A1 * | 10/2004 | Shieh | B60N 2/002 701/45 |
| 2007/0132559 | A1 * | 6/2007 | Schleeh | B60R 21/01532 340/425.5 |
| 2013/0092677 | A1 * | 4/2013 | Virnich | B60R 21/0154 219/202 |
| 2013/0098890 | A1 * | 4/2013 | Virnich | B60R 21/01532 219/202 |
| 2015/0048845 | A1 * | 2/2015 | Petereit | B62D 1/046 324/663 |
| 2017/0373686 | A1 * | 12/2017 | Wendt | H03K 17/962 |
| 2018/0345894 | A1 * | 12/2018 | Althaus | B60R 21/01556 |
| 2018/0358941 | A1 * | 12/2018 | Lamesch | G01D 5/24 |
| 2019/0031130 | A1 * | 1/2019 | Lamesch | B60R 21/01532 |
| 2020/0116530 | A1 * | 4/2020 | Lamesch | H03F 3/45475 |
| 2020/0198498 | A1 * | 6/2020 | Althaus | B60N 2/002 |
| 2021/0013882 | A1 * | 1/2021 | Lamesch | H03K 17/955 |
| 2021/0146799 | A1 * | 5/2021 | Althaus | G01N 27/223 |
| 2021/0270637 | A1 * | 9/2021 | Sabourin | G01R 31/006 |
| 2021/0356298 | A1 * | 11/2021 | Althaus | B60R 16/027 |
| 2022/0155355 | A1 * | 5/2022 | Farsch | G01R 27/2605 |
| 2022/0200594 | A1 * | 6/2022 | Faber | H03K 17/955 |
| 2022/0376691 | A1 * | 11/2022 | Faber | H03K 17/962 |
| 2023/0219515 | A1 * | 7/2023 | Althaus | B60R 21/0154 307/10.1 |

FOREIGN PATENT DOCUMENTS

| | | | | |
|---|---|---|---|---|
| EP | 1795402 | A1 * | 6/2007 | ....... B60R 21/01532 |
| EP | 2168808 | A1 * | 3/2010 | ............ B60N 2/002 |
| EP | 3375692 | A1 * | 9/2018 | ............ A61B 5/053 |
| JP | H11278203 | A | 10/1999 | |
| LU | 88828 | A1 * | 4/1998 | |
| LU | 101321 | B1 * | 1/2021 | ........... B60R 21/015 |
| LU | 102444 | B1 * | 7/2022 | ............ B62D 1/046 |
| LU | 500032 | B1 * | 10/2022 | ............ H03K 17/62 |
| LU | 500033 | B1 * | 10/2022 | |
| WO | WO-9731238 | A1 * | 8/1997 | ............ B60N 2/002 |
| WO | 2016107910 | A1 | 7/2016 | |
| WO | 2017102386 | A1 | 6/2017 | |
| WO | WO-2018229172 | A1 * | 12/2018 | ............ B60N 2/002 |
| WO | WO-2018229263 | A1 * | 12/2018 | ............ B60N 2/002 |
| WO | WO-2019154914 | A1 * | 8/2019 | ............ G01D 5/24 |
| WO | WO-2020114858 | A1 * | 6/2020 | ............ B60N 2/002 |
| WO | WO-2020208043 | A1 * | 10/2020 | ........... B60R 21/015 |
| WO | WO-2021005112 | A1 * | 1/2021 | ............... B62D 1/04 |
| WO | WO-2022023369 | A1 * | 2/2022 | ....... B60R 21/01532 |
| WO | WO-2022101485 | A1 * | 5/2022 | ............ H03K 17/62 |
| WO | WO-2022112330 | A1 * | 6/2022 | ............ B62D 1/046 |

OTHER PUBLICATIONS

Written Opinion corresponding to International Application No. PCT/EP2020/059938, dated Jul. 2, 2020, 6 pages.
Joshua Smith et al., "Electric Field Sensing For Graphical Interfaces", IEEE Computer Graphics and Applications, Computer Graphics and Applications, vol. 18, No. 3, dated May 1, 1998, pp. 54-60.

* cited by examiner

STATE OF THE ART

STATE OF THE ART

'A'                                                 'B'

CAPACITIVE SENSOR DEVICE WITH SELECTIVE LOADING AND COUPLING MEASUREMENT MODE

TECHNICAL FIELD

The invention relates to a capacitive measurement circuit for determining complex electric currents in a capacitive sensing device, a capacitive sensing device with such capacitive measurement circuit and a method of operating such capacitive sensing device.

BACKGROUND

Capacitive sensors and capacitive measurement and/or detection devices employing capacitive sensors have a wide range of applications, and are among others used for the detection of the presence and/or the position of a conductive body or body portion in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In the field of automotive vehicle sensor application it is known to employ capacitive sensors in vehicle seat occupant sensing systems for providing input to Automatic Driver Assistance Systems (ADAS), for instance for the purpose of a seat belt reminder (SBR) system or an activation control for an auxiliary restraint system (ARS). Sensed signals can serve as a basis for making decisions by an ADAS, for instance for a decision to deploy an air bag system to a specific vehicle seat or not.

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "Electric Field Sensing for Graphical Interfaces" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier (TIA), which is connected to the sensing electrode and which converts the current flowing into the sensing electrode into a voltage proportional to this current.

Some capacitive sensors are designed as sense-only capacitive sensors having a single sense electrode. Also, quite often capacitive sensors are used that comprise a sense electrode and a so-called "guard electrode" that are proximally arranged and mutually galvanically insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

By way of example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

Another example for the use of capacitive sensors in an automotive vehicle application is the so-called Hands off Detection (HoD) system, in which one or more sensors provide information about whether a driver has his hands on a steering wheel of a vehicle or not. This information can be transferred to an ADAS such as an Adaptive Cruise Control (ACC), which, based on the provided sensor signal, can alert the driver and remind him or her to take control of the steering wheel again. In particular, such HoD systems can be used in support to fulfill a requirement of the Vienna convention that the driver must remain in control of the vehicle at all times. HoD systems may as well be employed in a parking assistance system or an ADAS that is configured for evaluating a driver activity at high speed.

A capacitive sensor device of today that is integrated in a vehicle steering wheel typically comprises separate capacitive sensors that are configured to detect a driver's hands proximity to a predefined area of the steering wheel. The capacitive sensors may be located on the steering wheel surface for detecting a driver's hands at, on and/or around the steering wheel and for assigning the detection result a steering wheel holding position classification such as "no hand touching", "hands touching" or "hands grasping".

An example of a conventional capacitive sensing device with two separate capacitive sensors is illustrated in FIG. 1. Detection zones of the two capacitive sensors are indicated by two circular rings which are shown offset from each other in FIG. 1 for clarity purposes.

In the lower left part of FIG. 1, there is shown a steering wheel holding position in which a driver's hand is grasping the vehicle steering wheel rim. In the lower right part of FIG. 1, there is shown a steering wheel holding position in which each of a driver's hands is touching a front surface and a rear surface of the vehicle steering wheel, respectively. With the described conventional capacitive sensing device it is impossible to distinguish between these two vehicle steering wheel holding positions.

Even if the number of capacitive sensors in the capacitive sensing device is increased, such ambiguities may occur.

FIG. 2 schematically illustrates detection zones of a conventional capacitive sensing devices with three separate capacitive sensors. One zone is located at the rear surface of the steering wheel rim, and the two other zones are formed by two separate halves of a circular ring.

In the lower left part of FIG. 2, there is shown a steering wheel holding position in which each of a driver's hands is grasping the vehicle steering wheel rim at another side (scenario 'A'). In the lower right part of FIG. 2, there is shown a steering wheel holding position in which one of a driver's hands is touching the vehicle steering wheel and the other one of the driver's hands is grasping the vehicle steering wheel rim, respectively (scenario 'B'). Again, with the described conventional capacitive sensing device it is impossible to distinguish between these two vehicle steering wheel holding positions.

SUMMARY

It is therefore an object of the invention to provide a capacitive sensing device with an improved capability for distinguishing different scenarios. More specifically, it is desirable to provide a capacitive sensing device that is capable of distinguishing an as large variety as possible of steering wheel holding positions.

In one aspect of the present invention, the object may be achieved by a capacitive measurement circuit for determining complex electric currents in a capacitive sensing device that includes a plurality of electrically conductive antenna electrodes.

The capacitive measurement circuit comprises a measurement signal voltage source, a remotely controllable switching unit and a current measurement circuit.

The measurement signal voltage source is configured for providing an alternating measurement voltage at a voltage output port. The remotely controllable switching unit includes a plurality of ports and a plurality of switching members that are configured to operatively and selectively provide electrical connections between selected ports. The current measurement circuit is operatively connected to one of the ports of the switching unit.

The voltage output port is operatively connected to another port of the switching unit. Each antenna electrode of the plurality of electrically conductive antenna electrodes is individually connectable to a distinct port of the switching unit.

The switching unit is configured, by being controlled, to selectively connect, within a same measurement cycle,
the antenna electrodes, one at a time, or
at least two of the antenna electrodes at the same time,
to the voltage output port and the current measurement circuit.

The switching unit is further configured, by being controlled, to selectively connect, within the same measurement cycle and at another point in time, at least one of the antenna electrodes to the voltage output port and at least one other antenna electrode to the current measurement circuit.

The phrase "being configured to", as used in this application, shall in particular be understood as being specifically programmed, laid out, furnished or arranged.

In this way, the switching unit is configured to provide the electrical connections that are required for operating the antenna electrode or the at least two antenna electrodes in loading mode. The switching unit is further configured to provide the electrical connections that are required for operating the at least one antenna electrode and the at least one other antenna electrode in coupling mode. In this case, the at least one antenna electrode is connected to the voltage output port as a transmitting antenna electrode and the at least one other antenna electrode as a receiving antenna electrode is connected to the current measurement circuit.

In other words, the proposed capacitive measurement circuit enables, within the same measurement cycle, operating single antenna electrodes or a group of antenna electrodes, which comprises at least two electrically connected antenna electrodes, in loading mode, and further, at another point in time, operating distinct antenna electrodes or two distinct groups of antenna electrodes, each of which comprises at least two electrically connected antenna electrodes, in coupling mode.

By operating the antenna electrodes individually or in electrically connected groups in loading mode at one point in time and operating two antenna electrodes individually or an individual antenna electrode and at least one group of connected antenna electrodes in coupling mode at another point in time, sufficient information can be provided that can enable distinguishing an enlarged number of potential scenarios that may cause ambiguities when sensed with capacitive sensing devices having conventional capacitive measurement circuits.

In another aspect of the invention, a capacitive sensing device is provided. The capacitive sensing device comprises a plurality of electrically conductive antenna electrodes and a capacitive measurement circuit as disclosed herein. Each antenna electrode of the plurality of electrically conductive antenna electrodes is individually connected to a distinct port of the switching unit.

The capacitive sensing device further includes a signal processing unit that is configured for receiving and further processing of output signals from the current measurement circuit.

Furthermore, the capacitive sensing device comprises an electronic control unit. The electronic control unit is at least configured:
  for automatically controlling the switching unit, and
  for evaluating the processed signals received from the signal processing unit during a measurement cycle.

The benefits described in context with the capacitive measurement circuit apply to the proposed capacitive sensing device to the full extent.

The disclosed capacitive measurement circuit and capacitive sensing device are beneficially employable in particular in the field of automotive applications. The term "automotive", as used in this patent application, shall particularly be understood as being suitable for use in vehicles including passenger cars, trucks, semi-trailer trucks and buses.

In preferred embodiments of the capacitive sensing device, the electronic control unit is formed by a microcontroller that includes a digital data memory unit, a processor unit with data access to the digital data memory unit and a control interface. Such equipped microcontrollers are commercially available nowadays in many variations and at economic prices. In this way, an automated operation of the capacitive sensing device employing the capacitive measurement circuit disclosed herein can be enabled.

Usually, the microcontroller may include a microcontroller system clock for exact timing during automatic operation of the capacitive sensing device.

Preferably, the control interface is designed as a CAN (Controller Area Network) interface, which has the advantage of being compatible to existing automotive standards.

In preferred embodiments of the capacitive sensing system, the remotely controllable switching unit is configured to be controlled by a switch remote control unit that forms part of the electronic control unit. In this way, short electrical switching pathways can be achieved, which are less susceptible to electromagnetic interference.

Preferably, the signal processing unit or the electronic control unit is configured to evaluate stored output signals by comparing with at least two predetermined conditions, and to generate a classification signal that is indicative of a present scenario, based on a fulfillment of the at least two predetermined conditions.

Also preferably, one of the at least two predetermined conditions refers to a signal received from the signal processing unit during operating one of the antenna electrodes individually or an electrically connected group of antenna electrodes in loading mode, whereas the other one of the at least two predetermined conditions refers to a signal received from the signal processing unit during operating two antenna electrodes individually or an individual antenna electrode and at least one group of connected antenna electrodes in coupling mode. Combining a fulfillment of the at least two predetermined conditions can enable distinguishing an enlarged number of potential scenarios that may cause ambiguities when sensed with capacitive sensing devices having conventional capacitive measurement circuits.

In preferred embodiments of the capacitive sensing device, the electronic control unit is configured to control the switching unit into a plurality of different switching states constituting a measurement cycle. Here, at least one of the switching states is configured for operating one of the antenna electrodes at a time or a group of the antenna electrodes at the same time in loading mode. At least another one of the switching states is configured for operating at least two distinct antenna electrodes or at least two distinct groups of antenna electrodes in coupling mode, wherein each group of antenna electrodes comprises at least two electrically connected antenna electrodes. In this way, an automated operation of the proposed capacitive sensing device can easily be enabled.

Preferably, the electronic control unit is configured to control the switching unit periodically into the plurality of different switching states constituting the measurement cycle. A periodic time can easily be adjusted to meet any requirements regarding a dynamic behavior of the capacitive sensing device.

In preferred embodiments of the capacitive sensing device, the antenna electrodes of the plurality of antenna electrodes are arranged in at least two layers, and the layers are disposed in a spaced manner in a direction that is aligned to pierce the layers. This embodiment is particularly suitable for applications with complex geometry such as a vehicle steering wheel. Preferably, the direction is aligned perpendicular to the layers.

In another aspect of the invention, a vehicle steering wheel with capacitive hands off detection is proposed. The vehicle steering wheel comprises a capacitive sensing device as disclosed herein. In this way, a vehicle steering wheel with capacitive hands off detection can be provided, which is capable of distinguishing a wide variety of steering wheel holding positions with little or virtually no ambiguity.

In yet another aspect of the invention, a method of operating the capacitive sensing device disclosed herein is provided. The method comprises at least the following steps that are constituting a measurement cycle:
  select an antenna electrode of the plurality of antenna electrodes or a group of antenna electrodes of the plurality of antenna electrodes, wherein each group of antenna electrodes comprises at least two electrically connected antenna electrodes,
  control the switching unit to selectively connect solely the selected antenna electrode or the selected group of antenna electrodes to the voltage output port and the current measurement circuit,
  by the current measurement circuit, measure a complex current flowing through the selected antenna electrode or the selected group of antenna electrodes in response to the measurement voltage, receive and further process an output signal from the current measurement circuit that represents the measured complex current, store the processed output signal, repeat the preceding steps for a majority of the antenna electrodes of the plurality of antenna electrodes, select two distinct antenna electrodes or two distinct groups of antenna electrodes of the majority of antenna electrodes, control the switching unit to selectively connect one of the selected two distinct antenna electrodes or two distinct groups of antenna electrodes to the voltage output port and the other one of the selected two distinct antenna electrodes or two distinct groups of antenna electrodes to the current measurement circuit, by the current measurement circuit, measure a complex current flowing through the antenna electrode or the group of antenna electrodes that is connected to the current measurement circuit in response to the measurement voltage, receive and further process an output signal from the current measurement circuit that represents the measured complex current, store the processed output signal, select two other distinct antenna electrodes or two other distinct groups of antenna electrodes of the majority of antenna electrodes, repeat the steps concerning two selected distinct antenna electrodes or two distinct selected groups of antenna electrodes for all antenna electrodes of the majority of antenna electrodes, retrieve the stored output signals, evaluate the stored output signals by comparing with at least two predetermined conditions, and generate a classification signal that is indicative of a present scenario, based on a fulfillment of the at least two predetermined conditions.

Again preferably, one of the at least two predetermined conditions refers to a signal received from the signal processing unit during operating one of the antenna electrodes individually or an electrically connected group of antenna electrodes in loading mode, whereas the other one of the at least two predetermined conditions refers to a signal received from the signal processing unit during operating two antenna electrodes individually or an individual antenna electrode and at least one group of connected antenna electrodes in coupling mode. Combining a fulfillment of the at least two predetermined conditions can enable distinguishing an enlarged number of potential scenarios that may cause ambiguities when sensed with capacitive sensing devices having conventional capacitive measurement circuits.

In yet another aspect of the invention, a software module for controlling an automatic execution of steps of an embodiment of the method disclosed herein is provided.

The method steps to be conducted are converted into a program code of the software module, wherein the program code is implementable in a non-transitory computer-readable medium such as a digital memory unit of the capacitive sensing device or of a separate electronic control unit and is executable by a processor unit of the capacitive sensing device or of a separate electronic control unit. Preferably, the digital memory unit and/or processor unit may be a digital memory unit and/or a processing unit of the electronic control unit of the capacitive sensing device. The processor unit may, alternatively or supplementary, be another processor unit that is especially assigned to execute at least some of the method steps.

The software module can enable a robust and reliable execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 3:
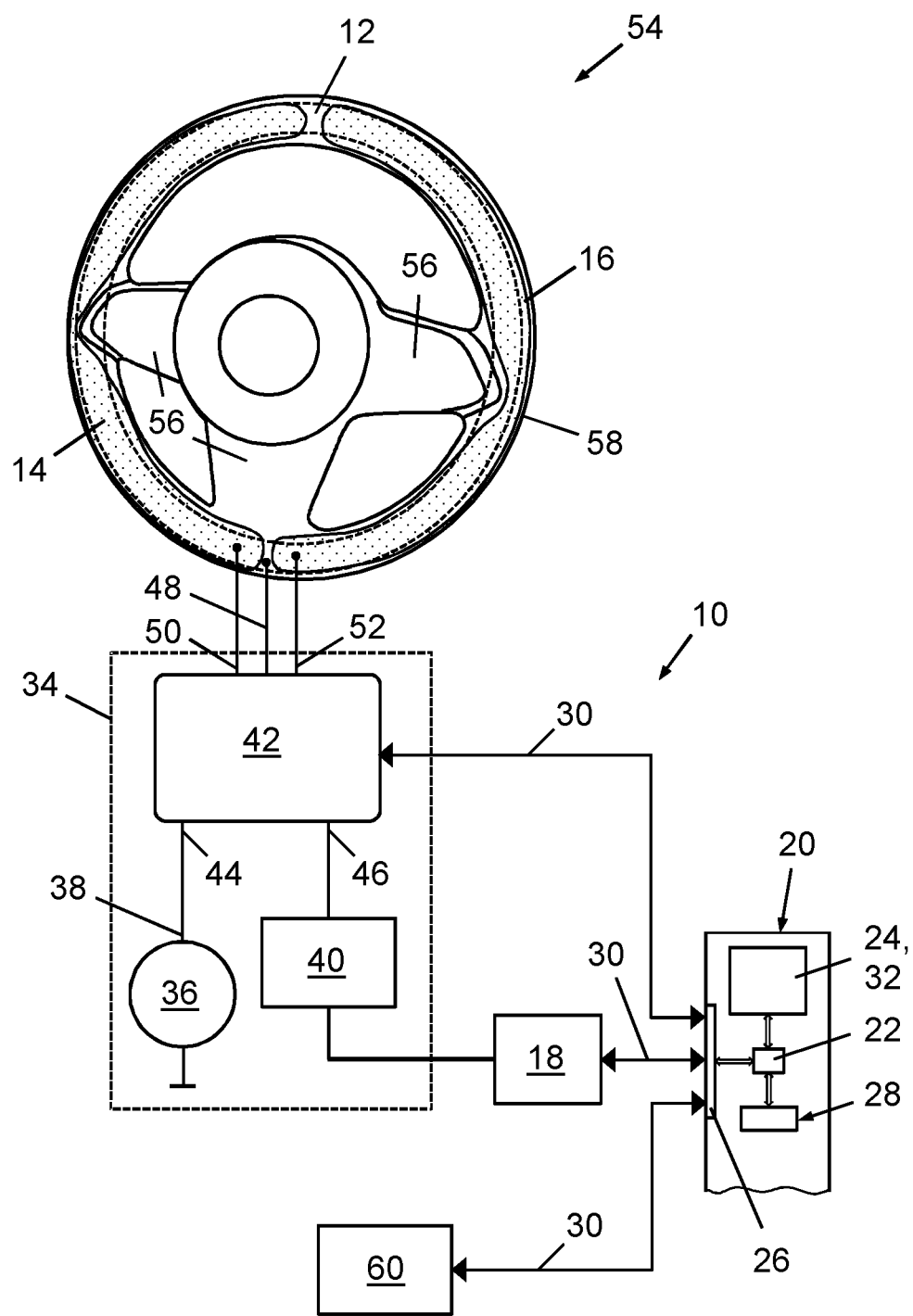

FIG. 3 schematically illustrates a vehicle steering wheel 54 with capacitive hands off detection (HoD), comprising a capacitive sensing device 10 with a capacitive measurement circuit 34. The vehicle is formed as a passenger car. The vehicle steering wheel 54 comprises three spokes 56 connected to an outer rim 58. The capacitive sensing device 10 includes a plurality of three electrically conductive antenna electrodes 12, 14, 16.

A first antenna electrode 12 of the plurality of three antenna electrodes 12, 14, 16 is designed as a circular ring (dashed lines) and is circumferentially arranged at a rear surface along the outer rim 58 of the vehicle steering wheel 54. A second antenna electrode 14 and a third antenna electrode 16 of the plurality of three antenna electrodes 12, 14, 16 are designed as circular half rings. The second antenna electrode 14 (shaded area) is circumferentially arranged at a left-hand side of a front surface of the outer rim 58 of the steering wheel 54. The third antenna electrode 16 (shaded area) is circumferentially arranged at a right-hand side of the front surface of the outer rim 58 of the steering wheel 54. In this way, the antenna electrodes 12, 14, 16 are arranged in two layers. The layers are disposed in a spaced manner in a direction that is perpendicular to the layers.

It is noted herewith that the terms "first", "second", etc. are used in this application for distinction purposes only, and are not meant to indicate or anticipate a sequence or a priority in any way.

The antenna electrodes 12, 14, 16 may be formed as printed metal electrodes attached on a flexible film carrier, as is well known in the art. Except for electrical connections that are deliberately provided by the capacitive measurement circuit 34, the antenna electrodes 12, 14, 16 are mutually galvanically separated from each other.

The vehicle steering wheel 54 comprises a leather trim that covers most part of the outer rim 58 and hides and protects the antenna electrodes 12, 14, 16 from external influences. The three antenna electrodes 12, 14, 16 cover a major amount of an outer surface of the outer rim 58 of the vehicle steering wheel 54.

The capacitive sensing device 10 comprises a capacitive measurement circuit 34 for determining complex electric currents. The capacitive measurement circuit 34 includes a measurement signal voltage source 36 that is configured for providing an alternating measurement voltage at a voltage output port 38. The capacitive measurement circuit 34 also comprises a current measurement circuit 40 including current measurement means.

The current measurement means may include one or more transimpedance amplifiers (TIA), whose function is to convert a complex current into an output voltage that is proportional to the determined current. The current measurement means may alternatively include analog-to-digital converters connected in parallel to an impedance of an a priori known value. In principle, any other current measurement means that appear suitable for those skilled in the art may be employed.

The capacitive measurement circuit 34 is configured for determining a complex impedance of an unknown capacitance from the determined complex current and the provided alternating measurement voltage. The unknown complex impedance represents a position of an object relative to one of the antenna electrodes 12, 14, 16.

In this specific embodiment, the alternating measurement signal is formed as a periodic electrical measurement voltage, namely a sinusoidal measurement voltage. The periodic electrical measurement voltage may e.g. have a fundamental frequency in the range between 50 kHz to 10 MHz. In other possible embodiments, the alternating measurement signal generator may be configured to generate an alternating electrical measurement signal of different signal shape, such as a square waveform, and/or at a different fundamental frequency.

Furthermore, the capacitive measurement circuit 34 comprises a remotely controllable switching unit 42. The switching unit 42 includes a plurality of ports 44-52 and a plurality of switching members that are configured to operatively and selectively provide electrical connections between selected ports 44-52.

The switching members of the switching unit 42 may for instance be designed as semiconductor switches such as MOSFETs (metal-oxide-semiconductor field-effect transistor). Any other switching member that appears suitable to those skilled in the art may as well be used.

The voltage output port 38 of the measurement signal voltage source 36 is electrically connected to one port 44 of the plurality of ports 44-52 of the switching unit 42. The current measurement circuit 40 is operatively connected to another port 46 of the plurality of ports 44-52 of the switching unit 42. Each antenna electrode 12, 14, 16 of the plurality of three electrically conductive antenna electrodes 12, 14, 16 is individually connected to another distinct port 48, 50, 52 of the switching unit 42.

By being controlled, the switching unit 42 is configured to selectively connect, within a same measurement cycle, the antenna electrodes 12, 14, 16, one at a time, or two of the antenna electrodes 12, 14, 16 at the same time, to the voltage output port 38 and to the current measurement circuit 40. At another point in time of the same measurement cycle, the switching unit 42 is configured to selectively connect, by being controlled, at least one of the antenna electrodes 12, 14, 16 to the voltage output port 38 and one other antenna electrode 12, 14, 16 to the current measurement circuit 40.

Moreover, the capacitive sensing device 10 comprises a signal processing unit 18 that is configured for receiving and further processing of output signals from the current measurement circuit 40.

The capacitive sensing device 10 also includes an electronic control unit 20. The electronic control unit 20 is formed by a microcontroller that includes a digital data memory unit 24, a processor unit 22 with data access to the digital data memory unit 24 and a control interface 26. The capacitive sensing device 10 comprises a switch remote control unit 28 that is an integral part of the microprocessor. The control interface 26 may be designed as a CAN (Controller Area Network) interface.

The electronic control unit 20 is connected to the signal processing unit 18 for receiving data signals representing complex impedances that have been determined by the capacitive measurement circuit 34. The electronic control unit 20 is further configured for automatically controlling the switching unit 42 via the switch remote control unit 28, and for evaluating the processed signals received from the signal processing unit 18 during a measurement cycle. Appropriate control/data lines 30 are established.

The capacitive measurement circuit 34 and the electronic control unit 20 are installed in the vehicle, remote from the vehicle steering wheel 54. The electronic control unit 20 is data-linked with an ADAS 60 of the vehicle.

Figure 4A:
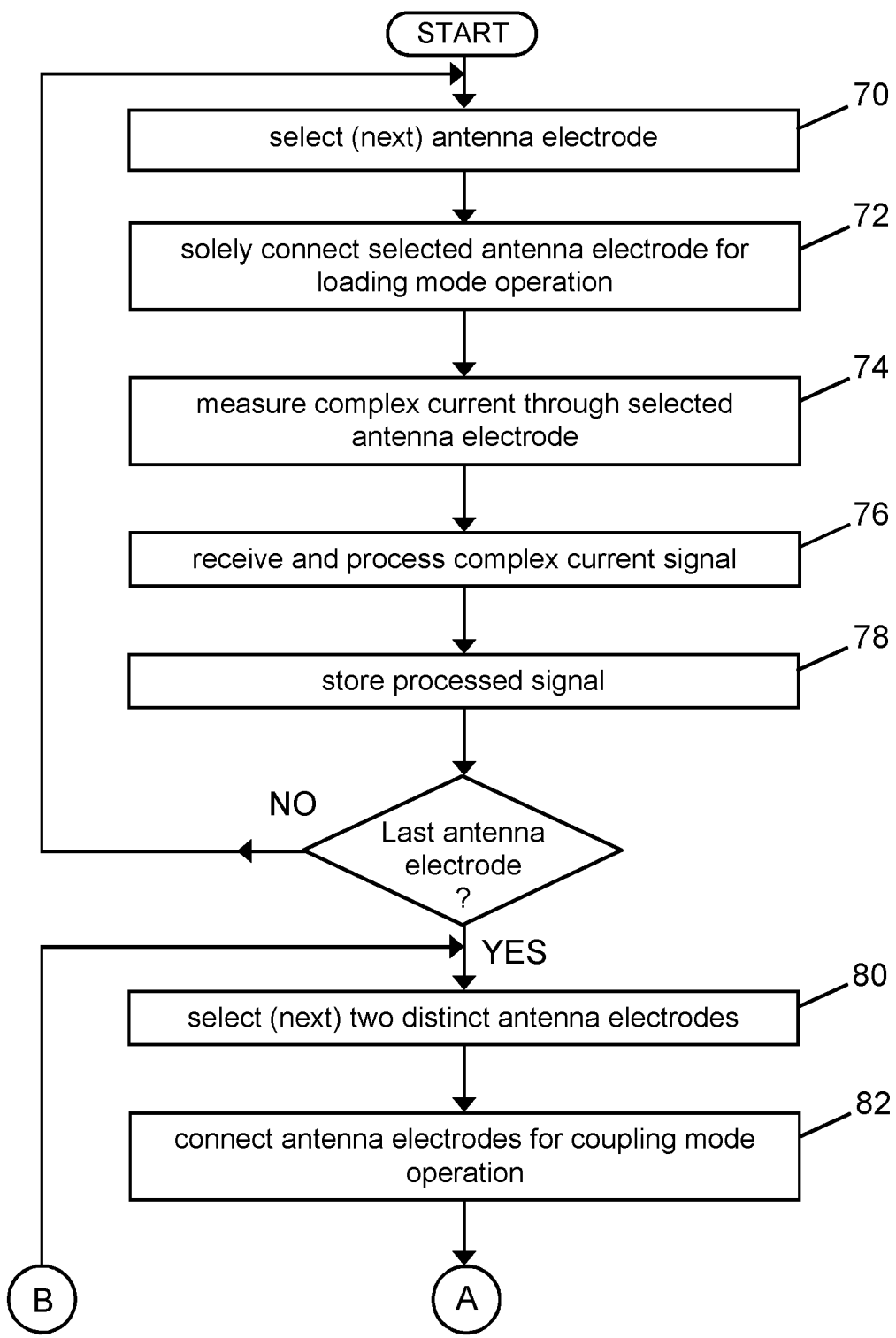
FIGS. 4a and 4b show a flow chart of a method of operating the capacitive sensing device pursuant to FIG. 3.
Figure 4B:
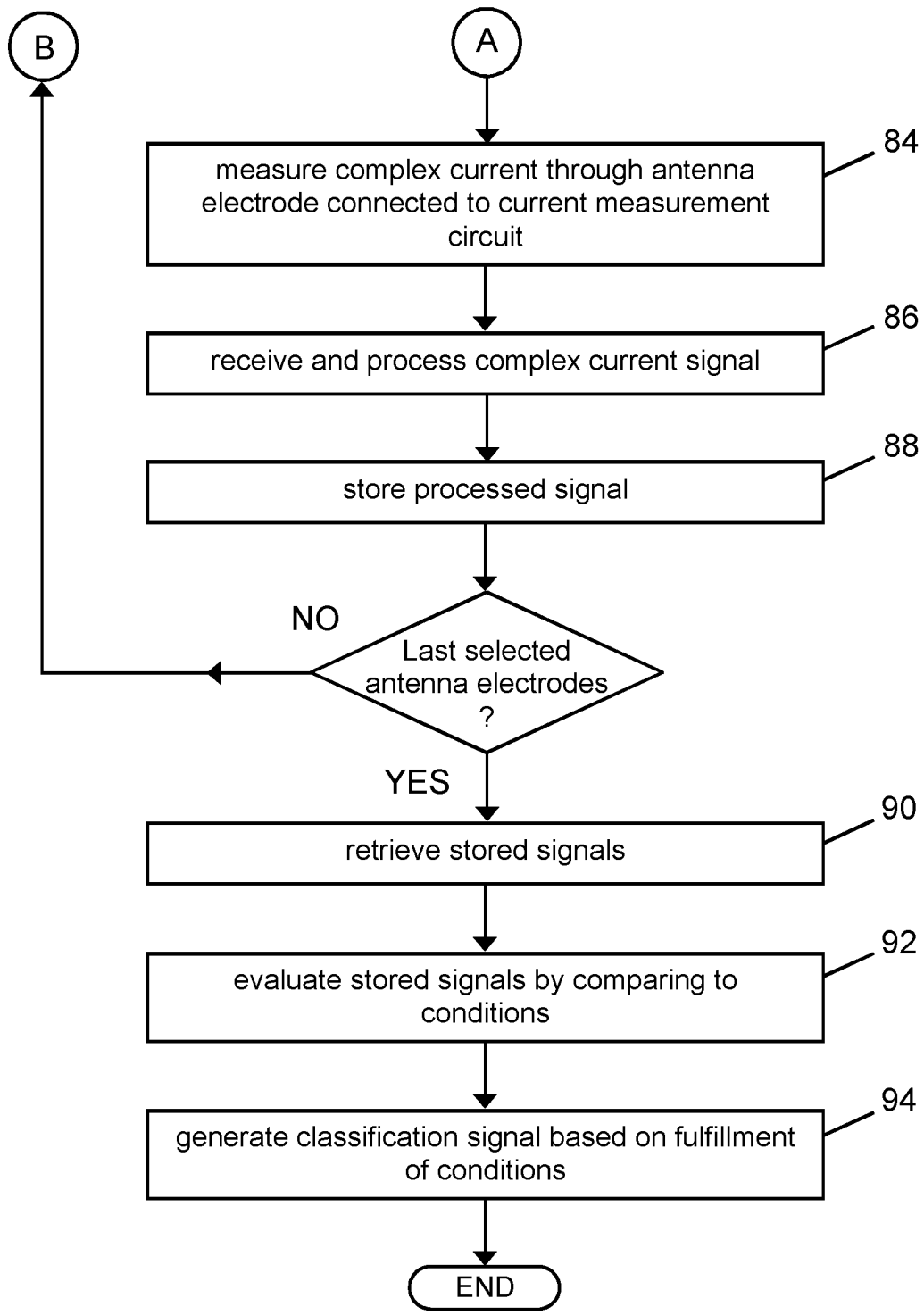

In the following, an embodiment of a method of operating the capacitive sensing device 10 pursuant to FIG. 3 will be described with reference to FIG. 3 and FIGS. 4a and 4b, in which a flowchart of the method is provided. In preparation of operating the capacitive sensing device 10, it shall be understood that all involved units and devices are in an operational state and configured as illustrated in FIG. 3.

In order to be able to automatically and periodically carry out the method, the electronic control unit 20 comprises a software module 32 (FIG. 3). The method steps to be conducted are converted into a program code of the software module 32. The program code is implemented in the digital data memory unit 24 of the electronic control unit 20 and is executable by the processor unit 22 of the electronic control unit 20. Alternatively, the software module 32 may as well reside in and may be executable by another control unit of the vehicle, and established data communication means between the electronic control unit 20 and the vehicle control unit would be used for enabling mutual data transfer.

The following steps constitute a measurement cycle. The electronic control unit 20 is configured to control an automatic repetition of the measurement cycle in a periodic manner.

In a first step 70 of the method, an antenna electrode 12 of the plurality of antenna electrodes 12, 14, 16 is selected. In another step 72, the switching unit 42 is controlled to selectively connect solely the selected antenna electrode 12 to the voltage output port 38 and the current measurement circuit 40 for loading mode operation of the selected antenna electrode 12. To this end, a complex current flowing through the selected antenna electrode 12 is measured by the current measurement circuit 40 in response to the measurement voltage in another step 74. Then, in a next step 76, an output signal from the current measurement circuit 40 that represents the measured complex current is received and further processed by the signal processing unit 18. In a subsequent step 78, the processed output signal is stored in the digital data memory unit 24 of the electronic control unit 20.

The preceding steps 70-78 are repeated for the other antenna electrodes 14, 16 of the plurality of antenna electrodes 12, 14, 16 such that all three antenna electrodes 12, 14, 16 have individually been operated in loading mode.

In a further step 80 of the method, two distinct antenna electrodes 12, 14 of the majority of antenna electrodes 12, 14, 16, which is given by all of the antenna electrodes 12, 14, 16, are selected. For instance, the first antenna electrode 12 and the second antenna electrode 16 may be selected. In other embodiments with a larger number of antenna electrodes, two distinct groups of antenna electrodes of the majority of antenna electrodes may be selected, wherein each group of antenna electrodes comprises at least two electrically connected antenna electrodes. In a next step 82 then, the switching unit 42 is controlled to selectively connect one 12 of the selected two distinct antenna electrodes 12, 14 to the voltage output port 38 and the other one 14 of the selected two distinct antenna electrodes 12, 14 to the current measurement circuit 40 for coupling mode operation of the selected antenna electrodes 12, 14. To this end, a complex current flowing through the selected antenna electrode 14 that is connected to the current measurement circuit 40 is measured by the current measurement circuit 40 in response to the measurement voltage in another step 84. Then, in a next step 86, an output signal from the current measurement circuit 40 that represents the measured complex current is received and further processed by the signal processing unit 18. In a subsequent step 88, the processed output signal is stored in the digital data memory unit 24 of the electronic control unit 20.

Then, steps 80-88 are repeated for two other distinct antenna electrodes 12, 16 of the majority of antenna electrodes 12, 14, 16, starting with a step of selecting two other distinct antenna electrodes 12, 16. For instance, the first antenna electrode 12 and the third antenna electrode 16 may be selected. The steps 80-88 concerning two selected distinct antenna electrodes are then repeated for all antenna electrodes 12, 14, 16 of the majority of antenna electrodes 12, 14, 16.

In a further step 90 of the method, the stored output signals are retrieved from the digital data memory unit 24. Then, in another step 92, the stored output signals are evaluated by comparing them with two predetermined conditions. For instance, the first predetermined condition may be expressed as the relation that a magnitude of the stored output signal exceeds a first predetermined threshold value. Further, the second predetermined condition may be expressed as the relation that a magnitude of the stored output signal exceeds a second predetermined threshold value.

Based on a fulfillment of the two predetermined conditions, a classification signal that is indicative of a present scenario is generated by the electronic control unit 20 in a further step 92.

Figure 1:
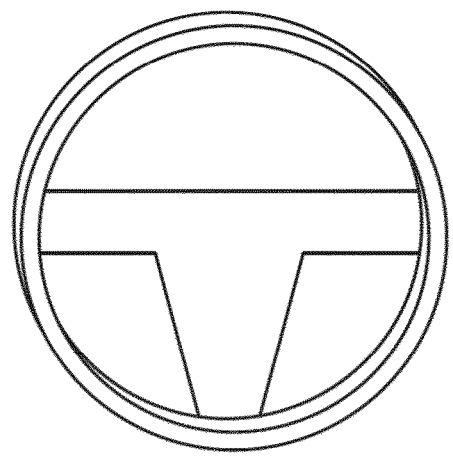
FIG. 1 schematically shows detection zones of a conventional hands off detection capacitive sensing device with two separate capacitive sensors and two indistinguishable vehicle steering wheel holding positions, FIG. 2 schematically shows detection zones of a conventional hands off detection capacitive sensing device with three separate capacitive sensors and two indistinguishable vehicle steering wheel holding positions, FIG. 3 schematically illustrates a vehicle steering wheel with capacitive hands off detection, comprising a capacitive sensing device with a capacitive measurement circuit in accordance with an embodiment of the invention.
Figure 1:
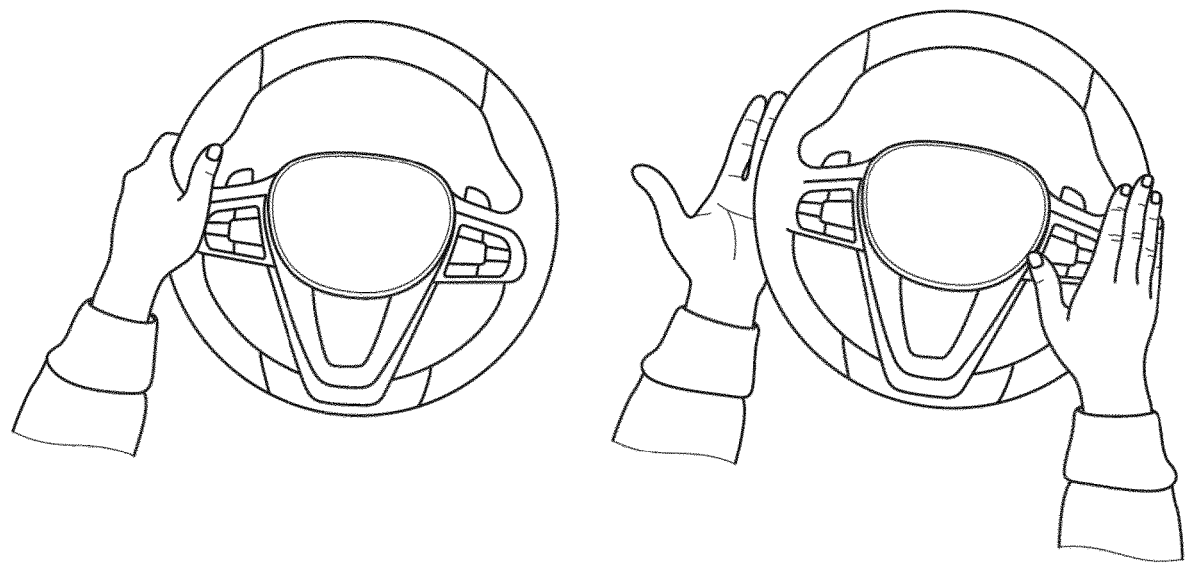
Figure 2:
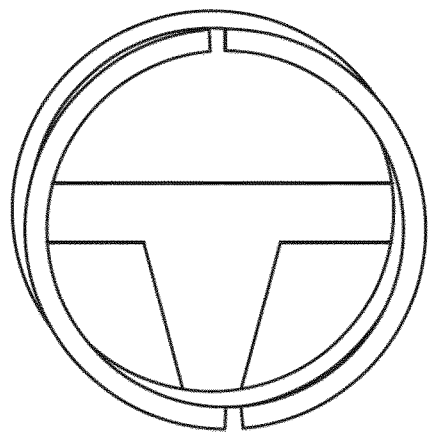
Figure 2:
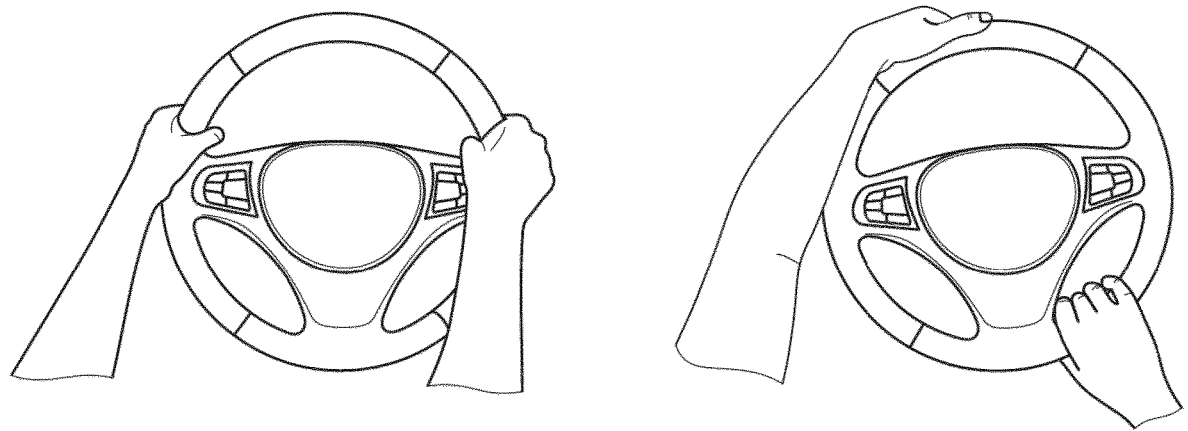

With reference to FIG. 2, the following results are to be expected from applying the method of operating the capacitive sensing device:

TABLE 1

| Scenario | Loading mode | Coupling mode 1$^{st}$ and 2$^{nd}$ antenna | Coupling mode 1$^{st}$ and 3$^{rd}$ antenna |
| --- | --- | --- | --- |
| 'A' | Large capacitance value | Large capacitance value | Large capacitance value |
| 'B' | Large capacitance value | Low capacitance value | Large capacitance value |

As is obvious from the table above, by choosing a suitable first predetermined threshold value and a suitable second predetermined threshold value, scenario CA' and scenario CB', which were described as being indistinguishable for a conventional capacitive sensing device, can be distinguished by operating the capacitive sensing device 10 and the capacitive measurement circuit 34.

Other possible embodiments of a measurement cycle that are as well contemplated may comprise variations in sequence or number of loading mode and coupling mode operation of a different number of antenna electrodes.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A capacitive sensing device, comprising:
    a plurality of electrically conductive antenna electrodes,
    a capacitive measurement circuit comprising:
    a measurement signal voltage source that is configured to provide an alternating measurement voltage at a voltage output port;
    a remotely controllable switching unit that includes a plurality of ports and a plurality of switching members that are configured to operatively and selectively provide electrical connections between selected ports; and
    a current measurement circuit operatively connected to one of the ports of the switching unit,
    wherein the voltage output port is operatively connected to another port of the switching unit, and wherein each antenna electrode of the plurality of electrically conductive antenna electrodes is individually connectable to a distinct port of the switching unit,
    a signal processing unit configured to receive and process output signals from the current measurement circuit, and
    an electronic control unit configured to:
        automatically control the switching unit, and
        evaluate the processed signals received from the signal processing unit during a measurement cycle,
    wherein the capacitive measuring circuit, within a same measurement cycle, is configured to:
        a) by the switching unit, selectively connect a single antenna electrode of the plurality of antenna electrodes, or a group of antenna electrodes of the plurality of antenna electrodes, to the voltage output port and the current measurement circuit in a loading mode, wherein each group includes at least two electrically connected antenna electrodes, and b) by the current measurement circuit, measure a complex current flowing through the selected single antenna electrode, or the selected group of electrodes, in response to the alternating measurement voltage at the voltage output port, wherein the signal processing unit, within the same measurement cycle, is configured to:

c) receive and process an output signal from the current measurement circuit that represents the measured complex current, wherein the electronic control unit, within the same measurement cycle, is configured to:

d) receive and store the processed output signal from the current measurement circuit, and e) control an automatic repetition of a)-d) in loading mode operation for each of the plurality of antenna electrodes, or for each group of antenna electrodes of the plurality of antenna electrodes, wherein the capacitive measuring circuit, within the same measurement cycle, is further configured to:

f) by the switching unit, selectively connect one of two distinct antenna electrodes of the plurality of antenna electrodes or one of two distinct groups of antenna electrodes of the plurality of antenna electrodes, to the voltage output port, and the other of the two distinct antenna electrodes of the plurality of antenna electrodes or the other of the two distinct groups of antenna electrodes of the plurality of antenna electrodes to the current measurement circuit in a coupling mode, wherein each group includes at least two electrically connected antenna electrodes, and g) by the current measurement circuit, measure a complex current flowing through the antenna electrode, or the group of electrodes, that is connected to the current measurement circuit in response to the alternating measurement voltage at the voltage output port, wherein the signal processing unit, within the same measurement cycle, is further configured to:

h) receive and process an output signal from the current measurement circuit that represents the measured complex current, wherein the electronic control unit, within the same measurement cycle, is further configured to:

i) receive and store the processed output signal from the current measurement circuit, and j) control an automatic repetition of f)-h) in coupling mode operation for two other distinct antenna electrodes of the plurality of antenna electrodes, or for two other distinct groups of antenna electrodes of the plurality of antenna electrodes, wherein a first antenna electrode of the plurality of antenna electrodes is a circular ring and circumferentially arranged at a rear surface along an outer rim of a vehicle steering wheel; a second antenna electrode of the plurality of antenna electrodes is a circular half ring and circumferentially arranged at a left-hand side of a front surface of the outer rim of the steering wheel; and a third antenna electrode of the plurality of antenna electrodes is a circular half ring and circumferentially arranged at a right-hand side of the front surface of the outer rim of the steering wheel.

2. The capacitive sensing device as claimed in claim 1, wherein the electronic control unit is formed by a microcontroller that includes a digital data memory unit, a processor unit with data access to the digital data memory unit and a control interface.

3. The capacitive sensing device as claimed in claim 1, wherein the remotely controllable switching unit is configured to be controlled by a switch remote control unit that forms part of the electronic control unit.

4. The capacitive sensing device as claimed in claim 1, wherein the signal processing unit or the electronic control unit is configured to evaluate stored output signals by comparing with at least two predetermined conditions, and to generate a classification signal that is indicative of a present scenario, based on a fulfillment of the at least two predetermined conditions.

5. The capacitive sensing device as claimed in claim 1, wherein the electronic control unit is configured to control the switching unit into a plurality of different switching states constituting a measurement cycle, wherein at least one of the switching states is configured for operating one of the antenna electrodes at a time or a group of the antenna electrodes at the same time in loading mode, and wherein at least another one of the switching states is configured for operating at least two distinct antenna electrodes or at least two distinct groups of antenna electrodes in coupling mode, wherein each group of antenna electrodes comprises at least two electrically connected antenna electrodes.

6. The capacitive sensing device as claimed in claim 1, wherein the antenna electrodes of the plurality of antenna electrodes are arranged in at least two layers, and wherein the layers are disposed in a spaced manner in a direction that is aligned to pierce the layers.

7. A vehicle steering wheel with capacitive hands off detection, comprising a capacitive sensing device as claimed in claim 1.

8. A method of operating the capacitive sensing device as claimed in claim 1, the method comprising at least the following steps that are constituting a measurement cycle:

select (70) an antenna electrode of the plurality of antenna electrodes or a group of antenna electrodes of the plurality of antenna electrodes, wherein each group of antenna electrodes comprises at least two electrically connected antenna electrodes, control (72) the switching unit to selectively connect solely the selected antenna electrode or the selected group of antenna electrodes to the voltage output port and the current measurement circuit, by the current measurement circuit, measure (74) a complex current flowing through the selected antenna electrode or the selected group of antenna electrodes in response to the measurement voltage, receive and further process (76) an output signal from the current measurement circuit that represents the measured complex current, store (78) the processed output signal, repeat the preceding steps (70-78) for a majority of the antenna electrodes of the plurality of antenna electrodes, select (80) two distinct antenna electrodes or two distinct groups of antenna electrodes of the majority of antenna electrodes, control (82) the switching unit to selectively connect one of the selected two distinct antenna electrodes or two distinct groups of antenna electrodes to the voltage output port and the other one of the selected two distinct antenna electrodes or two distinct groups of antenna electrodes to the current measurement circuit, by the current measurement circuit, measure (84) a complex current flowing through the antenna electrode or the group of antenna electrodes that is connected to the current measurement circuit in response to the measurement voltage, receive and further process (86) an output signal from the current measurement circuit that represents the measured complex current, store (88) the processed output signal, select two other distinct antenna electrodes or two other distinct groups of antenna electrodes of the majority of antenna electrodes, repeat the steps (82-88) concerning two selected distinct antenna electrodes or two distinct selected groups of antenna electrodes for all antenna electrode of the majority of antenna electrodes, retrieve (90) the stored output signals, evaluate (92) the stored output signals by comparing with at least two predetermined conditions, and generate (94) a classification signal that is indicative of a present scenario, based on a fulfilment of the at least two predetermined conditions.

9. A non-transitory computer-readable medium for controlling an automatic execution of steps of the method as claimed in claim 8, wherein the method steps are stored on the computer-readable medium as program code that is executable by a processor unit of the capacitive sensing device or of a separate electronic control unit.

* * * * *